United States Patent
Min et al.

(10) Patent No.: US 7,927,934 B2
(45) Date of Patent: Apr. 19, 2011

(54) SOI SEMICONDUCTOR DEVICE WITH BODY CONTACT AND METHOD THEREOF

(75) Inventors: Byoung W. Min, Austin, TX (US); Dharmesh Jawarani, Round Rock, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 561 days.

(21) Appl. No.: 11/734,328

(22) Filed: Apr. 12, 2007

(65) Prior Publication Data

US 2008/0254586 A1 Oct. 16, 2008

(51) Int. Cl.
*H01L 21/84* (2006.01)
(52) U.S. Cl. .............. 438/162; 438/525; 257/E21.345
(58) Field of Classification Search ........... 438/302, 438/162
See application file for complete search history.

(56) References Cited

U.S. PATENT DOCUMENTS

| | | | |
|---|---|---|---|
| 5,780,912 A | 7/1998 | Burr et al. | |
| 6,319,805 B1 * | 11/2001 | Iwamatsu et al. | 438/592 |
| 6,339,005 B1 | 1/2002 | Bryant et al. | |
| 6,525,381 B1 | 2/2003 | Long et al. | |
| 6,790,750 B1 * | 9/2004 | Long et al. | 438/517 |
| 7,410,876 B1 | 8/2008 | Min et al. | |
| 2007/0001245 A1 * | 1/2007 | Satoh et al. | 257/412 |

OTHER PUBLICATIONS

Mishel Matloubian, "Smart Body Contact for SOI MOSFETs," Texas Instruments, Inc., Dallas, pp. 128-129.
H.F. Wei, N.M. Kalkhoran, F. Namavar, and J.E. Chung, "Improvement of Breakdown Voltage and Off-State Leakage in Ge-Implanted SOI n-MOSFETs," IEEE 1993, pp. 739-742.
Terukazu Ohno, Mitsutoshi Takahashi, Akihiro Ohtaka, Yutaka Sakakibara, and Toshiaki Tsuchiya, "Suppression of the Parasitic Bipolar Effect in Ultra-Thin-Film nMOSFETs/SIMOX by Ar Ion Implantation into Source/Drain Regions," IEEE 1995, pp. 627-630.
D. Chang, S. Veeraraghavan, M. Mendicino, M. Rashed, D. Connelly, S. Jallepalli, J. Candelaria, "Efficacy of Ar in Reducing the Kink Effect on Floating-Body NFD/SOI CMOS," IEEE International SOI Conference, Oct. 1998, pp. 155-156.
Yamaguchi, T., et al., "Suppression of Anomalous Gate Edge Leakage Current by Control of Ni Silicidation Region using Si Ion Implantation Technique", Renesas, IEDM 2006, pp. 855-858.

* cited by examiner

*Primary Examiner* — Chandra Chaudhari
(74) *Attorney, Agent, or Firm* — Ranjeev Singh; Robert L. King

(57) ABSTRACT

A method including providing a substrate and providing an insulating layer overlying the substrate is provided. The method further includes providing a body region comprising a body material overlying the insulating layer. The method further includes forming at least one transistor overlying the insulating layer, the at least one transistor having a source, a drain and a gate with a sidewall spacer, the sidewall spacer comprising a substantially uniform geometric shape around the gate, the gate overlying the body region. The method further includes forming a first silicide region within the source and a second silicide region within the drain, the first silicide region having a differing geometric shape than the second silicide region and being electrically conductive between the body region and the source.

19 Claims, 5 Drawing Sheets

SOI SEMICONDUCTOR DEVICE WITH BODY CONTACT AND METHOD THEREOF

BACKGROUND

1. Field

This disclosure relates generally to semiconductor devices and methods of making the same, and more specifically, to a SOI semiconductor device with body contact and method thereof.

2. Related Art

SOI semiconductor devices deliver higher performance than bulk devices. At the same time, however, they suffer from problems, such as floating-body effect. In particular, since the body of the SOI semiconductor device is floating, as the drain voltage is increased, the body potential goes up. The increased body potential causes problems, such as increased leakage current and lowered threshold voltage.

Prior attempts at solving this problem have resulted in the formation of T-type SOI devices, which have a T-shaped polysilicon layer. T-type SOI devices, however, develop other problems, such as the presence of higher capacitance making them slower. In addition, such T-type SOI devices may have additional body resistance. As the SOI thickness is scaled down for high performance devices, increased body resistance may reduce the effectiveness of body contact.

Accordingly, there is a need for a SOI semiconductor device with body contact and method thereof.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
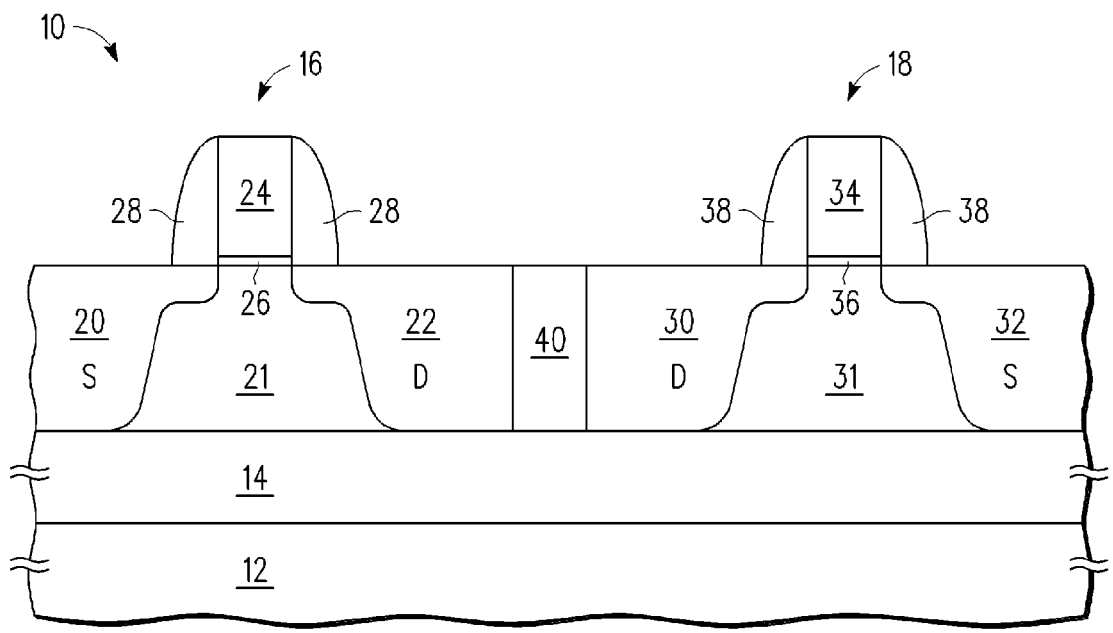
FIG. 1 is a view of a semiconductor device during a processing stage.

In one aspect, a method including providing a substrate and providing an insulating layer overlying the substrate is provided. The method further includes providing a body region comprising a body material overlying the insulating layer. The method further includes forming at least one transistor overlying the insulating layer, the at least one transistor having a source, a drain and a gate with a sidewall spacer, the sidewall spacer comprising a substantially uniform geometric shape around the gate, the gate overlying the body region. The method further includes forming a first silicide region within the source and a second silicide region within the drain, the first silicide region having a differing geometric shape than the second silicide region and being electrically conductive between the body region and the source.

In another aspect, a method forming a first transistor having a source, a drain and a gate surrounded by a sidewall spacer and overlying a body region, the first transistor overlying an insulator supported by a substrate is provided. The method further includes forming a second transistor having a source, a drain and a gate surrounded by a sidewall spacer and overlying a body region, the second transistor overlying the insulator and electrically isolated from the first transistor. The method further includes providing a mask overlying the second transistor. The method further includes angle implanting the first transistor with a first ion source that is directed to implant the source laterally adjacent the sidewall spacer thereof and to implant the drain at a separation distance that is laterally offset from the sidewall spacer thereof. The method further includes providing a mask overlying the first transistor. The method further includes angle implanting the second transistor with a second ion source that is directed to implant the source laterally adjacent the sidewall spacer thereof and to implant the drain at a separation distance that is laterally offset from the sidewall spacer thereof. The method further includes forming silicide regions to the source and drain of each of the first transistor and the second transistor, a source silicide region of the first transistor and second transistor respectively having a differing cross-sectional profile than a corresponding drain silicide region of the first transistor and the second transistor, the source silicide region of each of the first transistor and the second transistor respectively electrically coupling the body region and the source.

In yet another aspect, a semiconductor device including a substrate and an insulating layer overlying the substrate is provided. The semiconductor device further includes a body region comprising a body material overlying the insulating layer. The semiconductor device further includes at least one transistor overlying the insulating layer, the at least one transistor having a source, a drain and a gate, the gate overlying the body region. The semiconductor device further includes a first silicide region within the source and a second silicide region within the drain, the first silicide region having a differing geometric shape as a result of a differing cross-sectional profile than the second silicide region, and being electrically conductive between the body region and the source.

FIG. 1 shows a view of a semiconductor device 10 during a processing step. Semiconductor device 10 may comprise a device formed using semiconductor material on a buried oxide layer (BOX) 14, over a substrate 12. The semiconductor material described herein can be any semiconductor material or combinations of materials, such as gallium arsenide, silicon germanium, silicon, the like, and combinations of the above. To further illustrate the embodiments of the invention, semiconductor device 10 is shown as having two transistors 16, 18. Transistor 16 may have a source 20, a drain 22, a gate 24, and a body region 21. Gate 24 may be separated from body region 21 by gate dielectric 26. As shown, transistor 16 may have source 20 on the left side of gate 24 and drain 22 on the right side of gate 24. Transistor 16 may further include a spacer 28. In one embodiment, spacer 28 may have a substantially uniform geometric space around gate 24. Transistor 18 may have a drain 30, a source 32, a gate 34, and a body region 31. Gate 34 may be separated from body region 31 by gate dielectric 36. As shown, transistor 18 may have a drain 30 on the left side of gate 34 and source 32 on the right side of gate 34. Thus, transistor 18 may have its source and drain arranged in a mirror-reflection of transistor 16. Transistor 18 may further include a spacer 38. In one embodiment, spacer 38 may have a substantially uniform geometric space around gate 34. Transistors 16 and 18 may be separated from each other by an isolation region 40. Although FIG. 1 shows only two transistors, semiconductor device 10 may include many more transistors. Additionally, although FIG. 1 shows transistors 16 and 18, such that their drains are immediately adjacent to each other, they need not be such. In other words, the source of transistor 18 may be adjacent to drain of transistor 16, for example.

Figure 2:
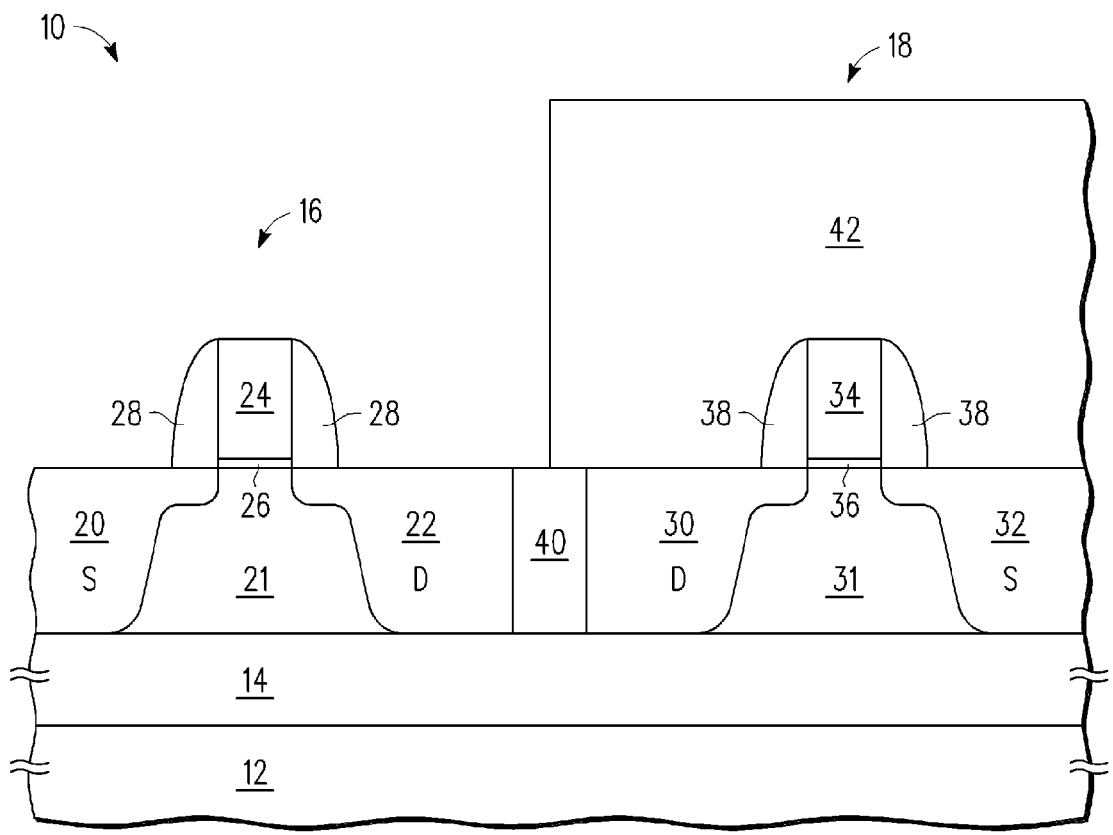
FIG. 2 is a view of a semiconductor device during a processing step.
Figure 3:
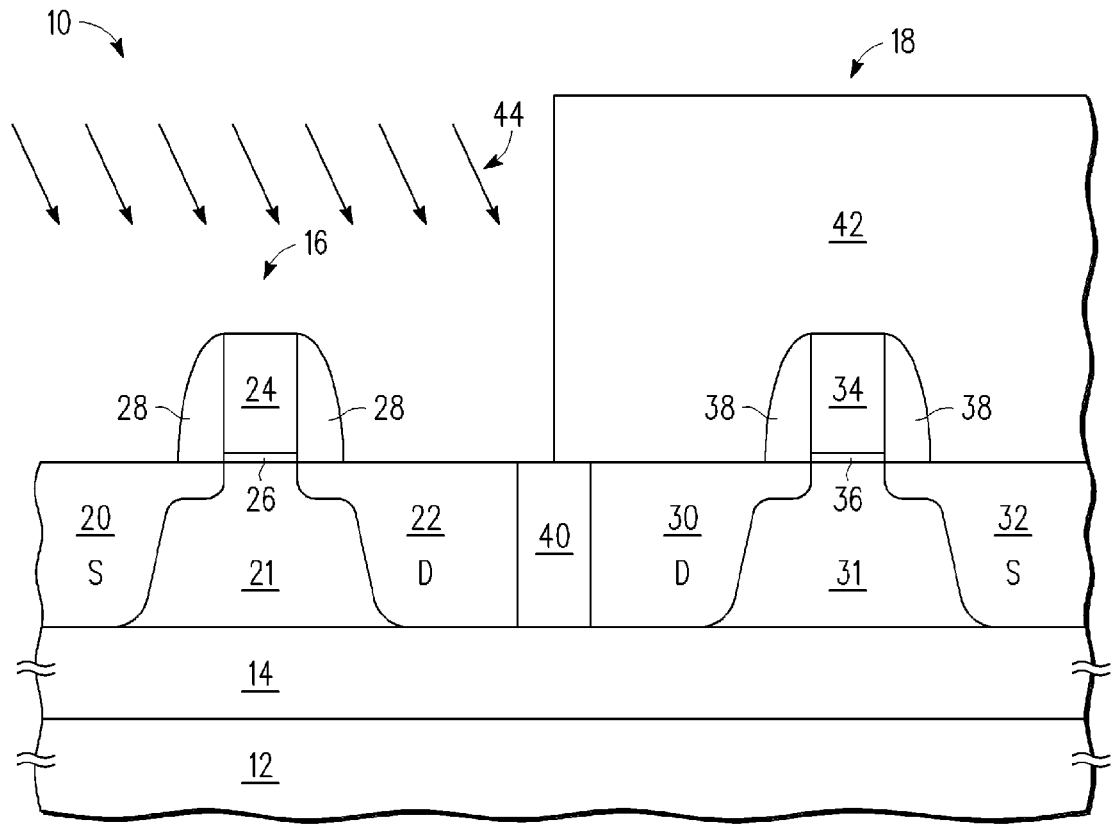
FIG. 3 is a view of a semiconductor device during a processing step.

As shown in FIG. 2, a photoresist mask 42 may be formed masking transistor 18. Next, as shown in FIG. 3, an angled implant may be performed at an angle of 30° to 60° with respect to a horizontal surface of source 20. In one embodiment, the angled implant may be performed immediately prior to forming the silicide regions for contacting source 20, drain 22, and gate 24. Materials, such as argon, germanium, xenon, arsenic, indium, antimony, or silicon may be used as part of this step. The angled implant may be performed at sufficient energy to damage at least a portion of body region 21 adjacent to the junction between source/drain extension regions and deep source/drain implant regions to form vacancy-rich regions. By way of example, arsenic may be implanted at an energy level of 20-50 keV and a dosage level of 1e15/cm$^2$, xenon may be implanted at an energy level of 70-140 keV and at a dosage level of 1e14/cm$^2$, and germanium may be implanted at an energy level of 10-80 keV and at a dosage level of 1e15/cm$^2$. After implantation, photoresist mask 42 may be removed using conventional mask removal techniques.

Figure 4:
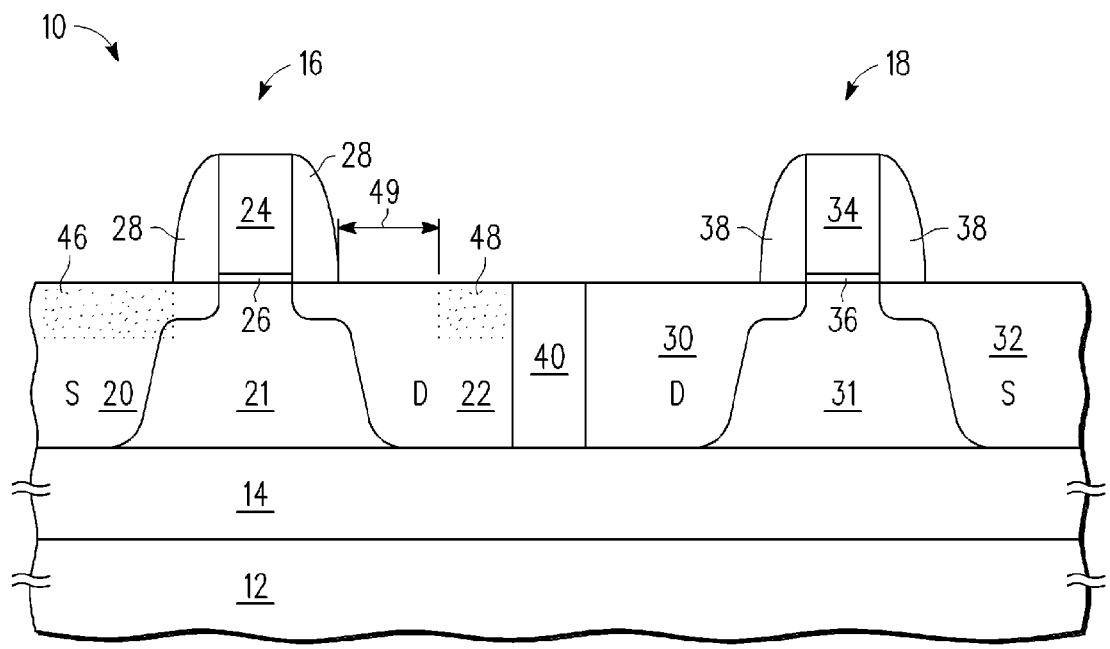
FIG. 4 is a view of a semiconductor device during a processing step.

Next, as shown in FIG. 4, as a result of implantation from the previous step, vacancy-rich regions 46 and 48 may be formed. Vacancy-rich regions 46 and 48 would have amorphized silicon, as a result of the implantation. In particular, vacancy-rich regions 46 and 48 would have structural defects caused by the implantation. As shown, because of the angled nature of the implant, the vacancy-rich regions 46 and 48 are asymmetric. Vacancy-rich region 46 extends into body region 21 and is closer to gate 24. Vacancy-rich region 48 does not extend into body region 21 and is farther from gate 24. In one embodiment, vacancy-rich region 48 may have a separation distance 49 from spacer 28.

Figure 5:
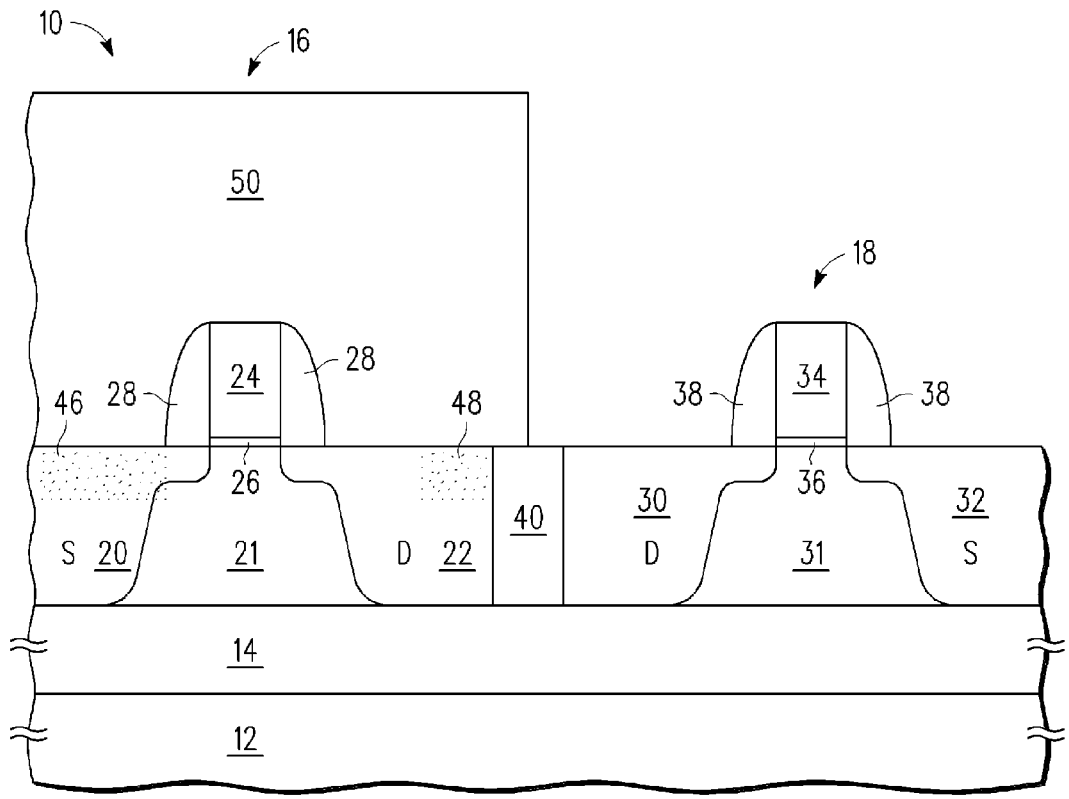
FIG. 5 is a view of a semiconductor device during a processing step.
Figure 6:
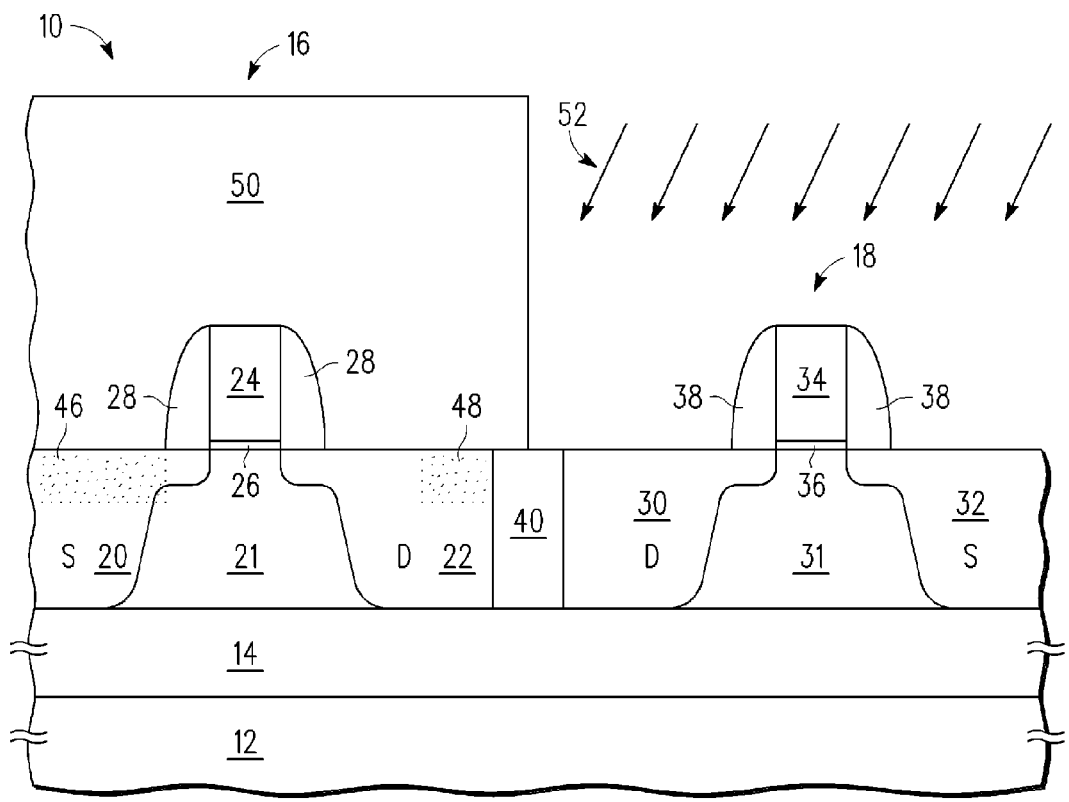
FIG. 6 is a view of a semiconductor device during a processing step.

Next, as shown in FIG. 5, a photoresist mask 50 may be formed masking transistor 16. Next, as shown in FIG. 6, an angled implant may be performed at an angle of 30° to 60° with respect to a horizontal surface of source 32. In one embodiment, the angled implant may be performed immediately prior to forming the silicide regions for contacting source 32, drain 30, and gate 34. Materials, such as argon, germanium, xenon, arsenic, indium, antimony, or silicon may be used as part of this step. The angled implant may be performed at sufficient energy to damage at least a portion of body region 31 adjacent to the junction between source/drain extension regions and deep source/drain implant regions to form vacancy-rich regions. By way of example, arsenic may be implanted at an energy level of 20-50 keV and a dosage level of 1e15/cm$^2$, xenon may be implanted at an energy level of 70-140 keV and at a dosage level of 1e14/cm$^2$, and germanium may be implanted at an energy level of 10-80 keV and at a dosage level of 1 e15/cm$^2$. After implantation, photoresist mask 50 may be removed using conventional mask removal techniques.

Figure 7:
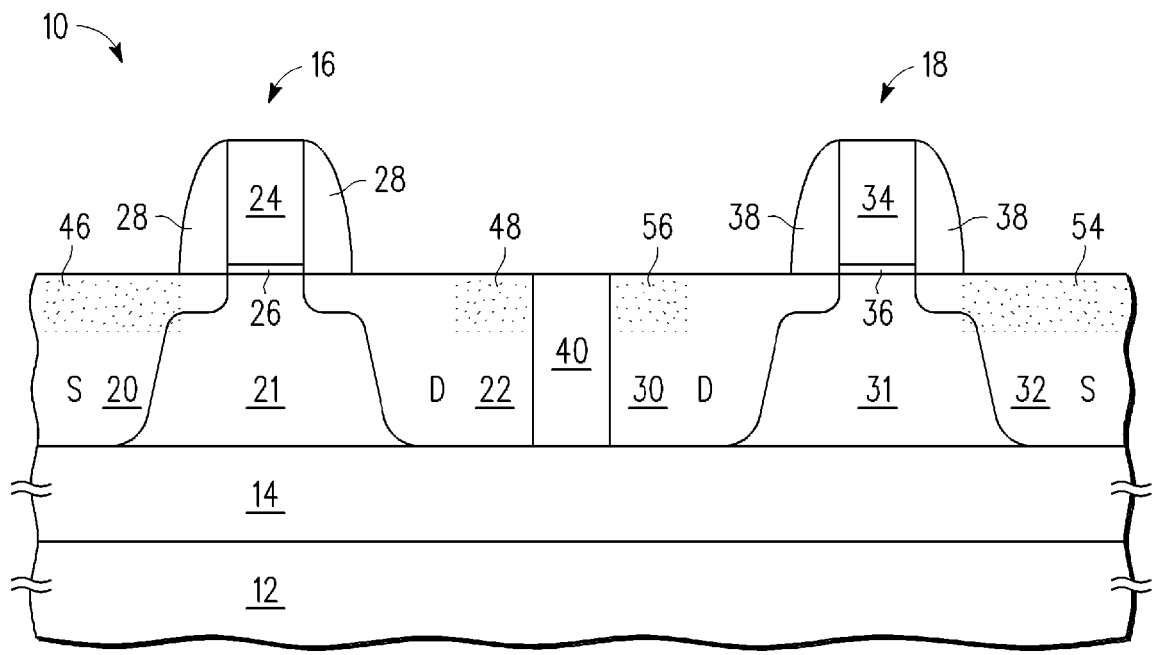
FIG. 7 is a view of a semiconductor device during a processing step.

Next, as shown in FIG. 7, as a result of implantation from the previous step, vacancy-rich regions 54 and 56 may be formed. Vacancy-rich regions 54 and 56 would have amorphized silicon, as a result of the implantation. In particular, vacancy-rich regions 54 and 56 would have structural defects caused by the implantation. As shown, because of the angled nature of the implant, the vacancy-rich regions 54 and 56 are asymmetric. Vacancy-rich region 54 extends into body region 31 and is closer to gate 34. Vacancy-rich region 56 does not extend into body region 31 and is farther from gate 34.

Figure 8:
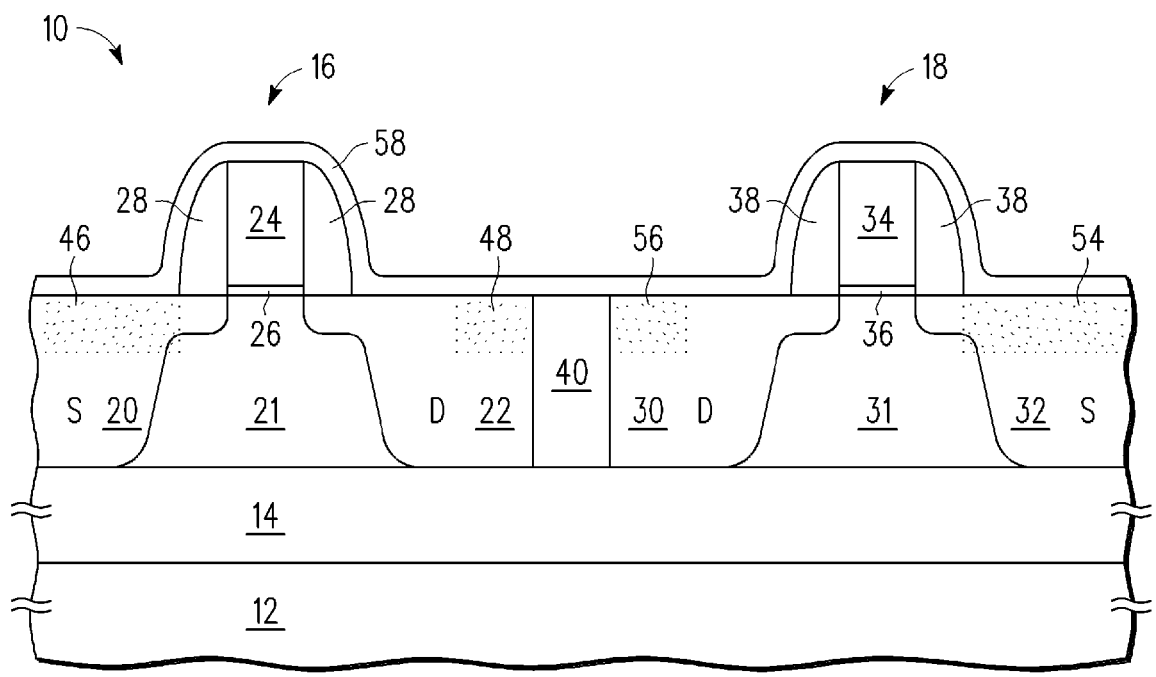
FIG. 8 is a view of a semiconductor device during a processing step.

Next, as shown in FIG. 8, a conductive layer 58 may be formed over transistors 16 and 18. Conductive layer 58 may be a metal layer formed using materials, such as nickel, cobalt, or titanium. Other suitable conductive materials, such as rare earth metals and refractory metals, including, platinum, erbium, and ytterbium, may also be used.

Figure 9:
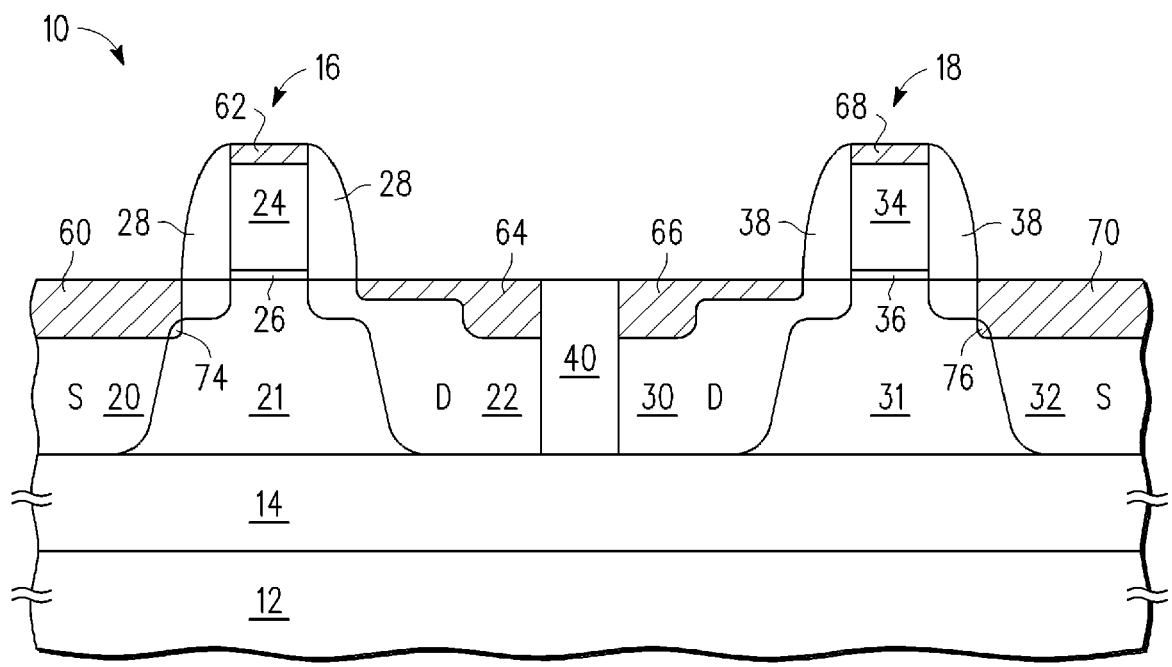
FIG. 9 is a view of a semiconductor device during a processing step.

Next, as shown in FIG. 9, conductive layer 58 may be subjected to an annealing step forming silicide regions 60, 62, 64, 66, 68, and 70. Annealing step may be performed in a manner such that silicide region 60 corresponding to source 20 of transistor 16 extends into body region 21 of transistor 16 up to a predetermined amount. Additionally, annealing step may be performed in a manner such that silicide region 70 extends into body region 31 of transistor 18 up to a predetermined amount. Annealing step may result in silicide region 60 having a different geometric shape from silicide region 64. Annealing step may further result in silicide region 60 having a different cross-sectional profile from silicide region 64. Annealing step may further result in silicide region 60 extending into body region 21 of transistor 16, as indicated by region 74. Annealing step may further result in silicide region 66 having a having a different geometric shape from silicide region 70. Annealing step may further result in silicide region 66 having a different cross-sectional profile from silicide region 70. As shown, silicide regions 64 and 66 corresponding to the drains of transistors 16 and 18 have a shallower depth closer to the channel than farther from the channel. Annealing step may further result in silicide region 70 extending into body region 31 of transistor 18, as indicated by region 76. Formation of region 74 may result in a direct conductive contact between source 20 and body region 21 of transistor 16, resulting in an elimination of the floating body effect. Similarly, formation of region 76 may result in a direct conductive contact between source 32 and body region 31 of transistor 18, resulting in an elimination of the floating body effect. Spacers 28 and 38 may be removed to enhance stress onto the channel region of transistors 16 and 18. Although FIG. 9 shows silicide region 60 extending into body region 21, silicide region 60 need not extend into body region 21. Instead, silicide region 60 may form contact with body region 21. The contact between silicide region 60 and body region 21 need not be a physical contact, instead, the contact may be an electrical contact that does not require silicide region 60 and body region 21 to be in physical contact. Similarly, although FIG. 9 shows silicide region 70 extending into body region 31, silicide region 70 need not extend into body region 31. Instead, silicide region 70 may form contact with body region 31. The contact between silicide region 70 and body region 31 need not be a physical contact, instead, the contact may be an electrical contact that does not require silicide region 70 and body region 31 to be in physical contact.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method comprising:
   providing a substrate;
   providing an insulating layer overlying the substrate;
   providing a body region comprising a body material overlying the insulating layer;
   forming at least one transistor overlying the insulating layer, the at least one transistor having a source, a drain and a gate with a sidewall spacer, the sidewall spacer comprising a substantially uniform geometric shape around the gate, the gate overlying the body region; and
   forming a first silicide region within the source and a second silicide region within the drain, the first silicide region having a differing geometric shape than the second silicide region and being electrically conductive between the body region and the source;
   forming a second transistor having a source, a drain and a gate and being electrically isolated from the at least one transistor, the second transistor having silicide regions formed in the source, the drain and the gate; and
   forming the first silicide region and second silicide region of the at least one transistor and the silicide regions of the second transistor by angled ion implanting the source, drain and gate of the at least one transistor with a first ion implant comprising germanium while masking the second transistor, and angled ion implanting the source, drain and gate of the second transistor with a second ion implant while masking the first transistor.

2. The method of claim 1 further comprising angling the first ion implant at a first angle and angling the second ion implant in a different direction from the first angle and having a substantially equal angle.

3. The method of claim 1 further comprising:
   forming the first silicide region to have a contact region that extends into the body material by making a surface region of the source adjacent the sidewall spacer amorphous prior to forming the first silicide region within the source.

4. The method of claim 1, wherein forming the first silicide region within the source further comprises making a controlled silicide penetration from the source to the body of the at least one transistor by ion implanting the source in a region immediately laterally adjacent to the sidewall spacer while not ion implanting the drain in a region immediately laterally adjacent to the sidewall spacer.

5. The method of claim 1, wherein forming a first silicide region within the source further comprises:
   ion implanting the source immediately laterally adjacent to the sidewall spacer while masking at least one additional transistor;
   masking the at least one transistor and ion implanting a source of the at least one additional transistor laterally adjacent to a sidewall spacer thereof;
   forming silicide overlying at least the source of the at least one transistor and the at least one additional transistor; and
   annealing the at least one transistor and the at least one additional transistor to form a source-to-body contact for each transistor.

6. A method comprising:
   forming a first transistor having a source, a drain and a gate surrounded by a sidewall spacer and overlying a body region, the first transistor overlying an insulator supported by a substrate;
   forming a second transistor having a source, a drain and a gate surrounded by a sidewall spacer and overlying a body region, the second transistor overlying the insulator and electrically isolated from the first transistor;
   providing a first mask overlying the second transistor;
   angle implanting the first transistor with a first ion source comprising germanium that is directed to implant the source laterally adjacent the sidewall spacer thereof and to implant the drain at a separation distance that is laterally offset from the sidewall spacer thereof;
   providing a second mask overlying the first transistor;
   angle implanting the second transistor with a second ion source that is directed to implant the source laterally adjacent the sidewall spacer thereof and to implant the drain at a separation distance that is laterally offset from the sidewall spacer thereof; and
   forming silicide regions to the source and drain of each of the first transistor and the second transistor, a source silicide region of the first transistor and second transistor respectively having a differing cross-sectional profile than a corresponding drain silicide region of the first transistor and the second transistor, the source silicide region of each of the first transistor and the second transistor respectively electrically coupling the body region and the source.

7. The method of claim 6 further comprising:
   using a same ion implant chemistry for the first ion implant and the second ion implant.

8. The method of claim 6 further comprising:
   using a same angle for angle implanting the first transistor and angle implanting the second transistor.

9. The method of claim 6, wherein forming silicide regions to the source and drain of each of the first transistor and the second transistor further comprises forming a conductive layer overlying the first transistor and the second transistor and annealing the conductive layer.

10. The method of claim 6, wherein angle implanting the first transistor and the second transistor forms a first amorphous region at all of a surface of the source of each of the first transistor and the second transistor and forms a second amorphous region at less than all of a surface of the drain of each of the first transistor and the second transistor.

11. The method of claim 6, wherein forming a source silicide region of the first transistor and second transistor respectively having a differing cross-sectional profile further comprises:
   forming the source silicide region of the each of the first transistor and the second transistor to have a greater depth immediately adjacent to the sidewall spacer than the corresponding drain silicide region of the first transistor and the second transistor immediately adjacent to the sidewall spacer.

12. The method of claim 6, wherein forming a source silicide region of the first transistor and second transistor respectively having a differing cross-sectional profile further comprises:
   forming the corresponding drain silicide region of each of the first transistor and the second transistor having two differing depths wherein a first depth closest to a channel is shallower than a second depth further removed from the channel.

13. The method of claim 6, wherein forming silicide regions to the source of each of the first transistor and the second transistor further comprises:
   forming a metallic layer overlying the first transistor and second transistor; and
   annealing the first transistor and second transistor until silicide from the source of the first transistor and the second transistor enter the body region a predetermined amount.

14. The method of claim 1 wherein the angled ion implanting of the source, drain, and gate of the at least one transistor is performed with sufficient energy to damage at least a portion of the body region to form vacancy-rich regions.

15. The method of claim 14 wherein first ion implant comprising germanium is implanted at an energy level of 10-80 keV and at a dosage level of $1e15/cm^2$.

16. The method of claim 1 wherein the angled ion implanting the source, drain and gate of the second transistor with the second ion implant comprises implanting germanium.

17. The method of claim 6 wherein the angle ion implanting of the first transistor is performed with sufficient energy to damage at least a portion of the body region to form vacancy-rich regions.

18. The method of claim 17 wherein the angled ion implant is performed at an energy level of 10-80 keV and at a dosage level of $1e15/cm^2$.

19. The method of claim 6 wherein the angle ion implanting of the second transistor comprises implanting germanium.

* * * * *